(12) United States Patent
Hashimoto

(10) Patent No.: US 7,349,217 B2
(45) Date of Patent: Mar. 25, 2008

(54) IC SOCKET ASSEMBLY

(75) Inventor: Shinichi Hashimoto, Kanagawa (JP)

(73) Assignee: Tyco Electronics AMP KK, Kanagawa-Ken (JP)

( * ) Notice: Subject to any disclaimer, the term of this patent is extended or adjusted under 35 U.S.C. 154(b) by 56 days.

(21) Appl. No.: 10/837,226

(22) Filed: Apr. 30, 2004

(65) Prior Publication Data
US 2004/0218365 A1 Nov. 4, 2004

(30) Foreign Application Priority Data
Apr. 30, 2003 (JP) ............................. 2003-125345

(51) Int. Cl.
H05K 7/20 (2006.01)
H01L 23/34 (2006.01)
H01L 21/82 (2006.01)
F28F 7/00 (2006.01)

(52) U.S. Cl. .................... 361/719; 361/704; 361/709; 257/718; 257/719; 165/80.1; 165/80.2; 438/122

(58) Field of Classification Search ................ 361/719, 361/704, 709; 257/718, 722, 719; 165/80.1–80.2; 438/122
See application file for complete search history.

(56) References Cited

U.S. PATENT DOCUMENTS

| | | | |
|---|---|---|---|
| 5,226,824 A * | 7/1993 | Karlovich et al. ............. | 439/70 |
| 6,082,440 A * | 7/2000 | Clemens et al. ............ | 165/80.3 |
| 6,243,267 B1 * | 6/2001 | Chuang ...................... | 361/704 |
| 6,344,971 B1 * | 2/2002 | Ju ............................. | 361/704 |
| 6,400,572 B1 * | 6/2002 | Wu ............................ | 361/704 |
| 6,421,242 B1 * | 7/2002 | Chen ........................ | 361/704 |
| 6,449,154 B1 * | 9/2002 | Yoneyama et al. ......... | 361/704 |
| 6,449,157 B1 * | 9/2002 | Chu ........................... | 361/704 |
| 6,473,306 B2 * | 10/2002 | Koseki et al. .............. | 361/704 |
| 6,522,545 B2 * | 2/2003 | Shia et al. .................. | 361/704 |
| 6,570,763 B1 * | 5/2003 | McHugh et al. ............ | 361/704 |
| 6,574,109 B1 * | 6/2003 | McHugh et al. ............ | 361/719 |
| 6,646,881 B1 * | 11/2003 | Lai et al. .................... | 361/719 |
| 6,678,160 B1 * | 1/2004 | Liu ............................ | 361/719 |
| 6,731,506 B1 * | 5/2004 | Dong et al. ................. | 361/719 |
| 6,778,395 B1 * | 8/2004 | Dong et al. ................. | 361/704 |
| 6,781,838 B2 * | 8/2004 | Shinotou .................... | 361/704 |
| RE38,677 E * | 12/2004 | Blomquist .................. | 361/704 |
| 6,854,993 B1 * | 2/2005 | McHugh et al. ............ | 439/196 |

(Continued)

FOREIGN PATENT DOCUMENTS

JP 9153694 6/1997

(Continued)

Primary Examiner—Jayprakash Gandhi
Assistant Examiner—Zachary M Pape
(74) Attorney, Agent, or Firm—Barley Snyder LLC

(57) ABSTRACT

The IC socket assembly includes the heat sink for abutting the upper surface of an IC package to dissipate heat generated thereby, and a fixing member for fixing the heat sink to the housing. The fixing member includes: a frame, mounted on a surface of the circuit board, on which the housing is mounted; a back plate, mounted on the opposite surface of the circuit board, having engaging arms, which are inserted through apertures of the circuit board and engage the frame; a pair of loading beams, fixed to the engaging arms; and a pair of levers, axially supported by the loading beams, for urging the heat sink toward the housing.

16 Claims, 14 Drawing Sheets

U.S. PATENT DOCUMENTS 6,924,984 B2 * 8/2005 Lee et al. .................... 361/704
2002/0024104 A1 * 2/2002 Earl ........................... 257/378

FOREIGN PATENT DOCUMENTS

| JP | 2000306646 | 11/2000 |
| JP | 2001-024370 | 1/2001 |
| JP | 2003-007942 | 1/2003 |

* cited by examiner

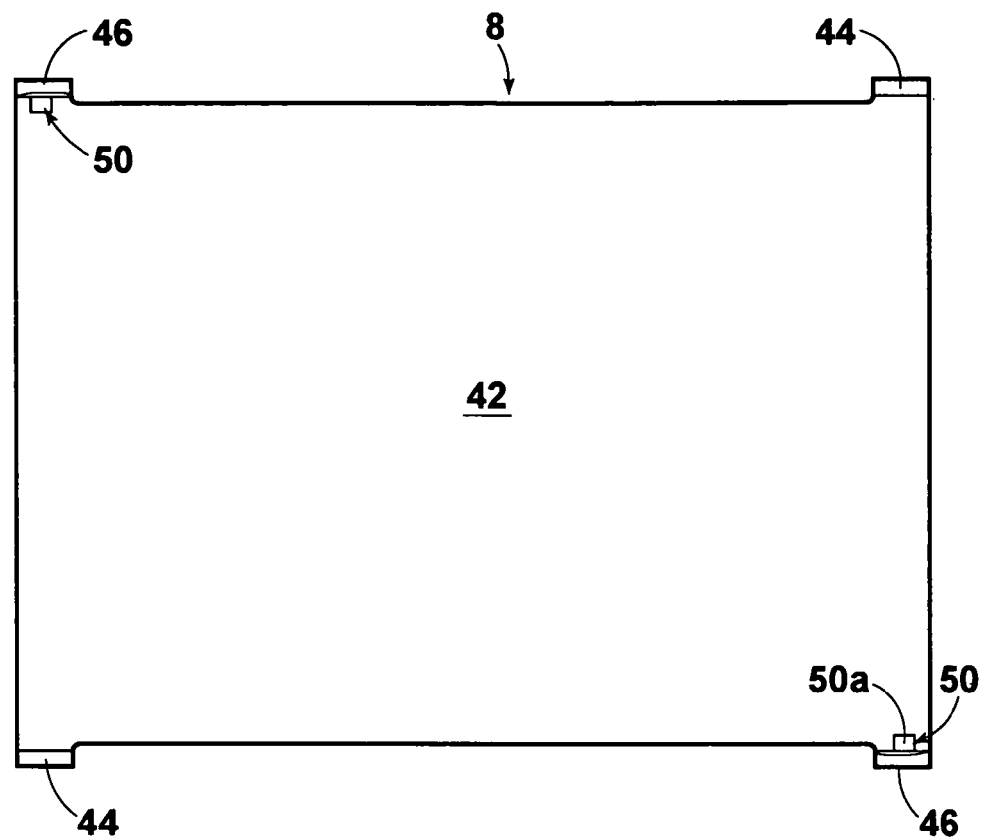
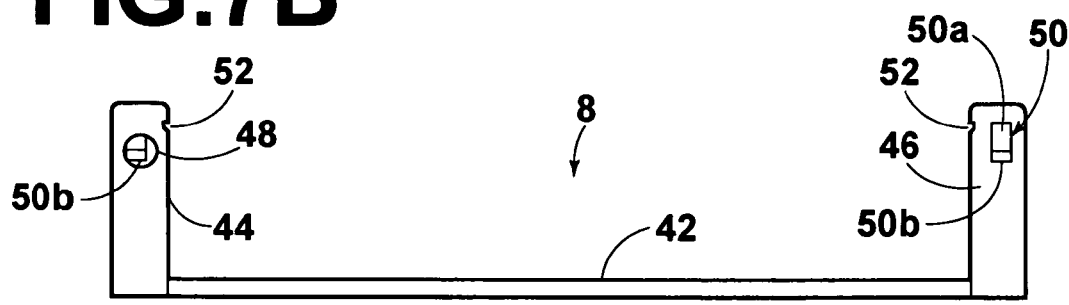
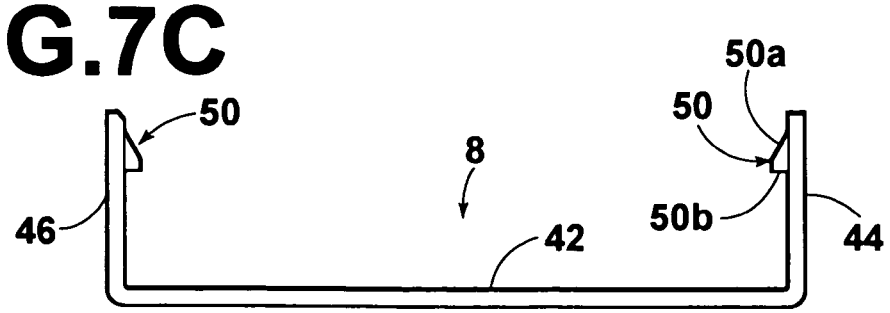

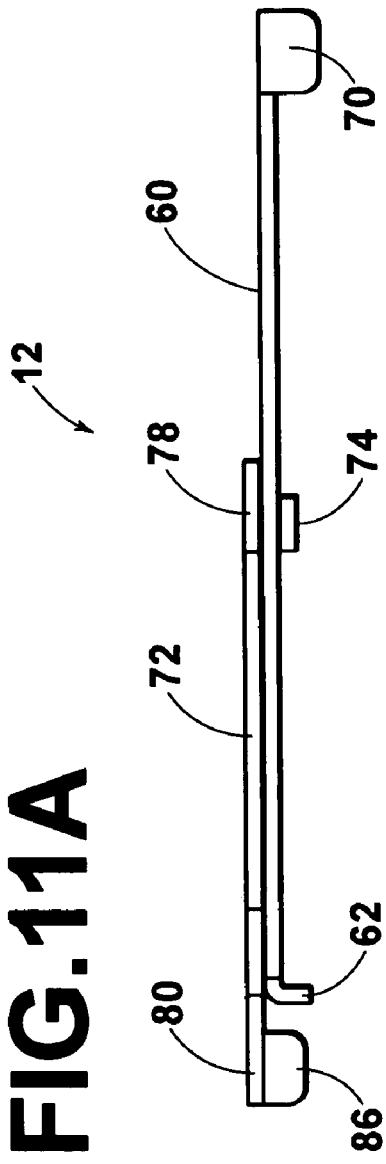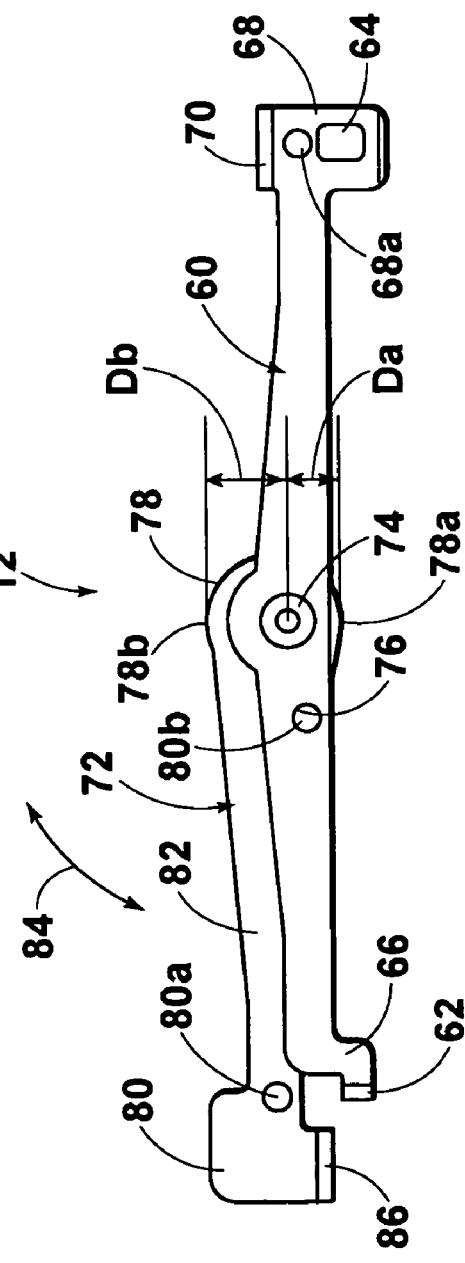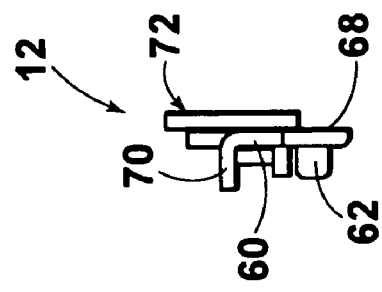

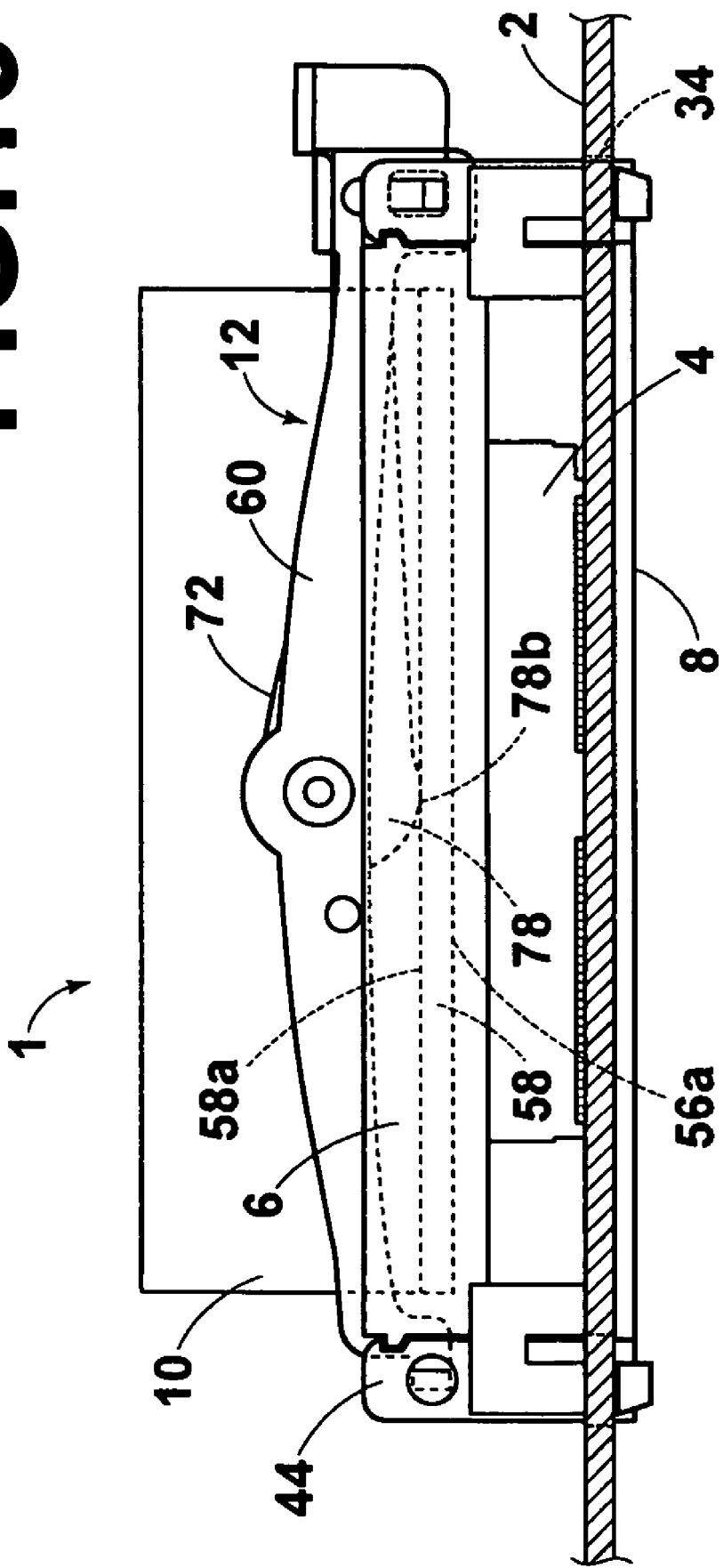

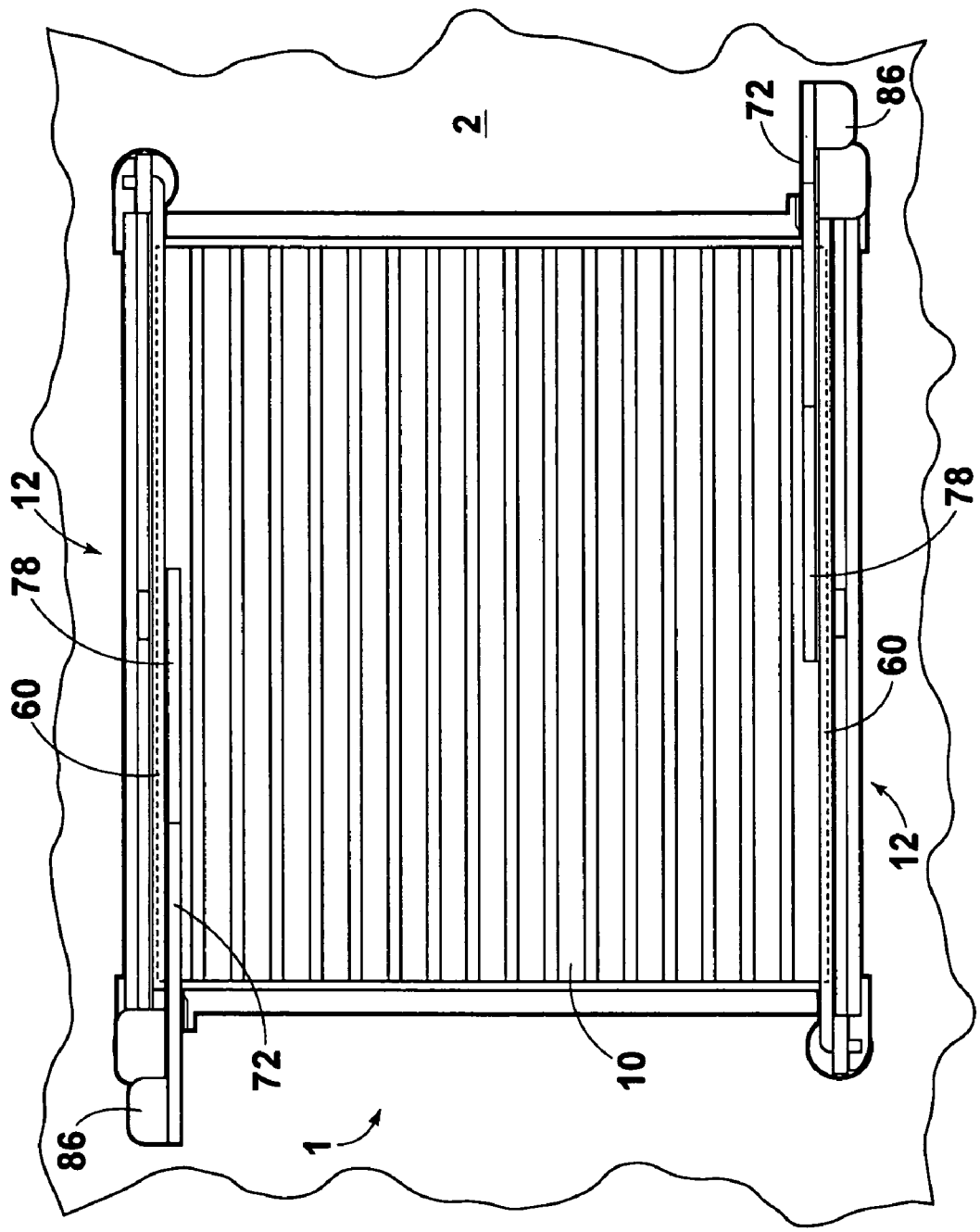

US 7,349,217 B2

IC SOCKET ASSEMBLY

FIELD OF THE INVENTION

The present invention relates to an Integrated Circuit (IC) socket having a heat sink that dissipates heat generated by an IC package. More particularly, the present invention relates to an IC socket assembly having a heat sink which contacts an IC package within the IC socket.

BACKGROUND OF THE INVENTION

A conventional Integrated Circuit (IC) socket assembly is disclosed in Japanese Unexamined Patent Publication No. 2001-24370 (FIGS. 1 and 2). This IC socket assembly comprises a heat sink mounted on an IC package, which is received in a socket housing. A linear mounting member is rotatably attached to the IC socket. The heat sink is pressed against and fixed to the IC package by the linear mounting member.

Another conventional IC socket assembly is disclosed in Japanese Unexamined Patent Publication No. 2003-7942 (FIG. 3). This IC socket assembly comprises a socket housing that houses a great number of electrical contacts therein, a heat sink that abuts the upper surface of an IC package which is mounted on the socket housing, and a fixing member for fixing the heat sink to the socket housing. The fixing member comprises a heat sink support and a heat sink base. The fixing member presses the heat sink against the IC package from one side of a printed circuit board, on which the socket housing is mounted. Thereby, the heat sink is urged into close contact with the IC package.

The IC socket assemblies disclosed in the aforementioned Japanese Unexamined Patent Publications mount the heat sinks onto the IC sockets so that they are urged toward the IC packages only on one side of the printed circuit boards. In both conventional IC socket assemblies, the forces exerted by the members for fixing the heat sinks are applied to the housings, via the IC packages. These forces may cause warping of the housings, adversely affecting the coplanarity between the bottom surfaces of the housings and the printed circuit board. As a result, the reliability of the electrical connections between the bottom surface of the housing (circuit board mounting surfaces) and the printed circuit board is compromised.

SUMMARY OF THE INVENTION

It is an object of the invention to provide an IC socket assembly that effectively reduces warping of a housing even if a heat sink is mounted thereon, thereby ensuring coplanarity of a circuit board mounting surface, with a circuit board.

The IC socket assembly includes the heat sink for abutting the upper surface of an IC package to dissipate heat generated thereby, and a fixing member for fixing the heat sink to the housing. The fixing member includes: a frame, mounted on a surface of the circuit board, on which the housing is mounted; a back plate, mounted on the opposite surface of the circuit board, having engaging arms, which are inserted through apertures of the circuit board and engage the frame; a pair of loading beams, fixed to the engaging arms; and a pair of levers, axially supported by the loading beams, for urging the heat sink toward the housing.

A configuration may be adopted wherein axial support portions of the levers axially support the levers in an eccentric manner. That is, the levers may be axially supported so that the peripheral edges of the axial support portions press against the heat sink accompanying rotation of the levers.

A configuration may be adopted wherein the pair of levers are joined via a link portion.

BRIEF DESCRIPTION OF THE DRAWINGS

FIG. 7A is a plan view, FIG. 7B is a front view, and FIG. 7C is a right side view of a back plate, which is utilized in the IC socket assembly of FIG. 1.

FIG. 11A is a plan view, FIG. 11B is a front view, and FIG. 11C is a side view of a loading beam subassembly in an open position first.

FIG. 13 is a front view of the IC socket assembly according to the first embodiment mounted on the circuit board, wherein a lever is rotated to its final position.

FIG. 14 is a plan view of the IC socket assembly according to the first embodiment mounted on the circuit board, wherein a lever is rotated to its final position.

DETAILED DESCRIPTION OF THE INVENTION

Figure 1:
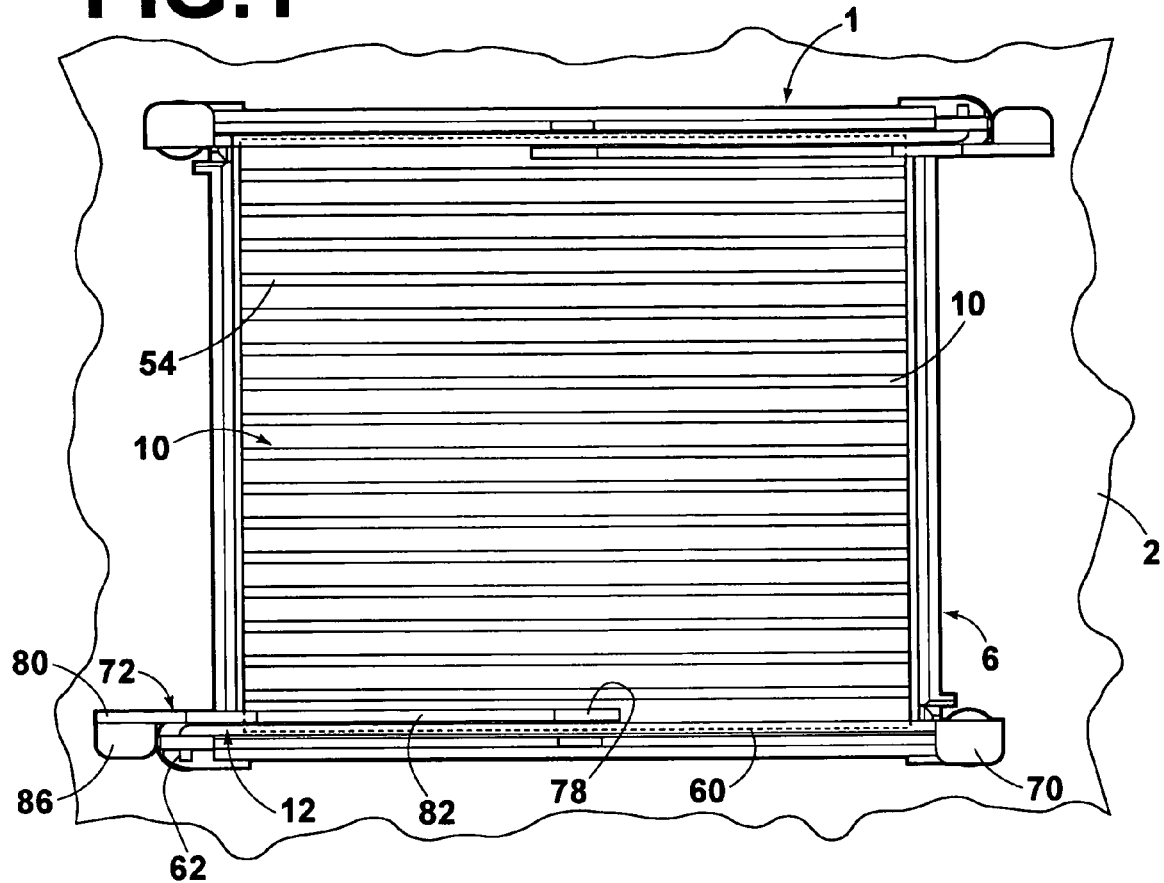
FIG. 1 is a plan view of an IC socket assembly according to a first embodiment of the invention, being mounted on a printed circuit board.
Figure 2:
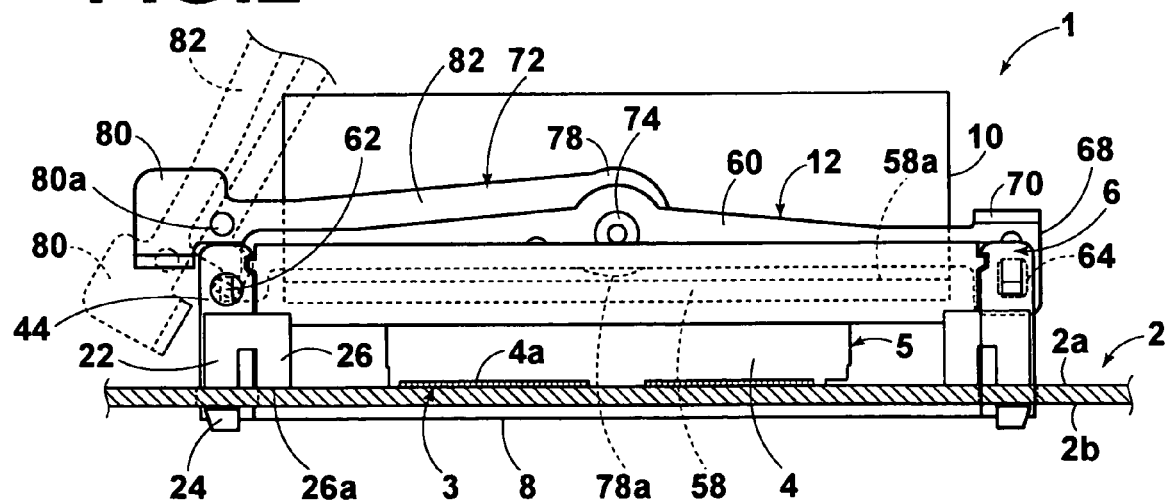
FIG. 2 is a front view of the IC socket assembly of FIG. 1.
Figure 3A:
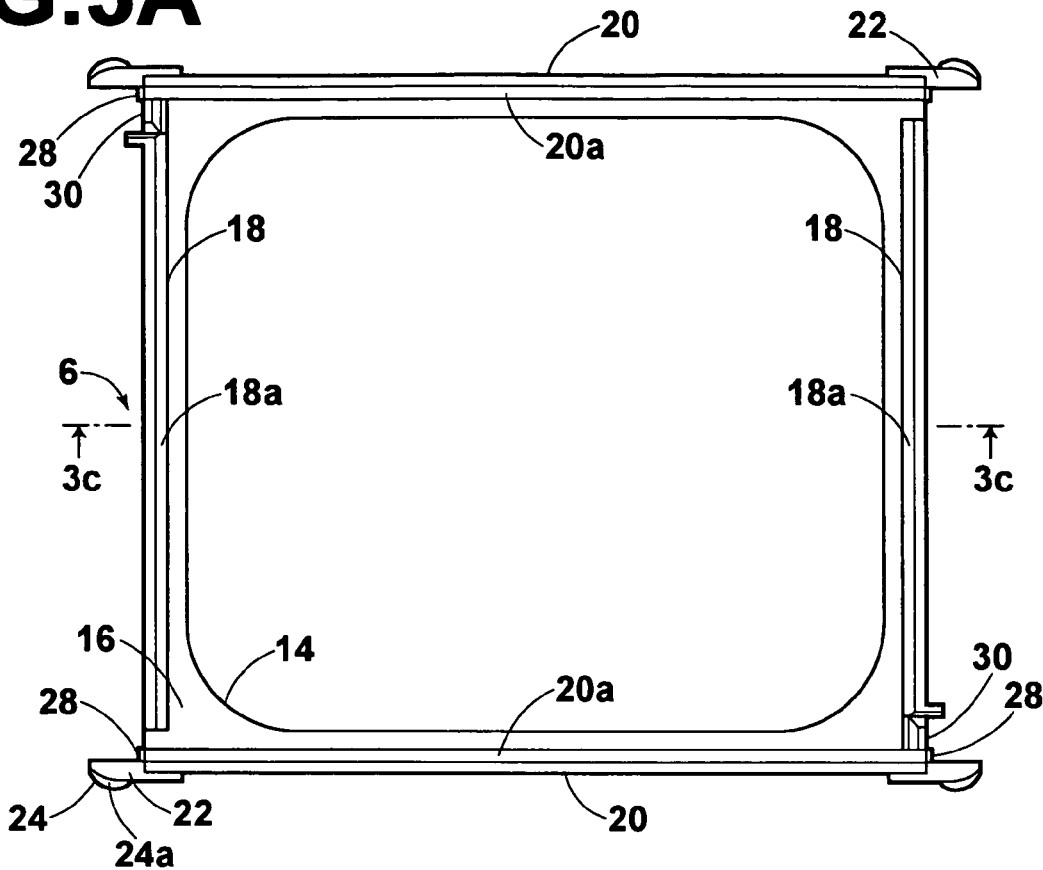
FIG. 3A is a plan view.
Figure 3B:
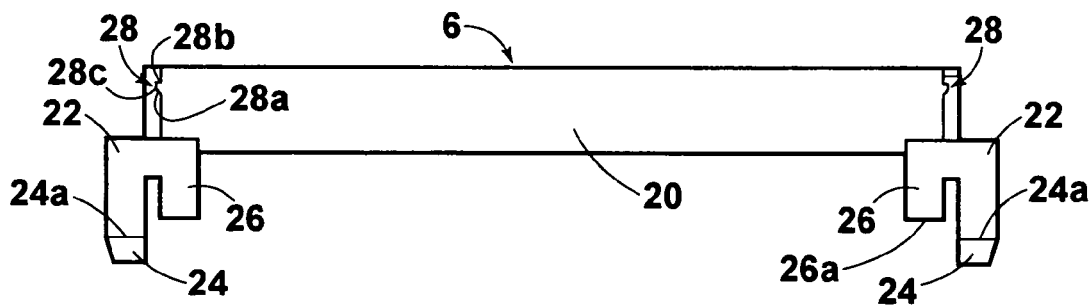
FIG. 3B is a front view.
Figure 3C:
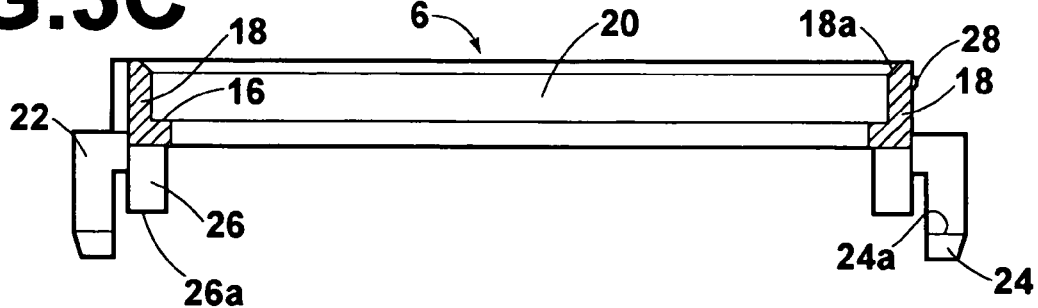
FIG. 3C is a sectional view taken along the line 3C-3C in FIG. 3A, of a frame which is utilized in the IC socket assembly of the invention.
Figure 4A:
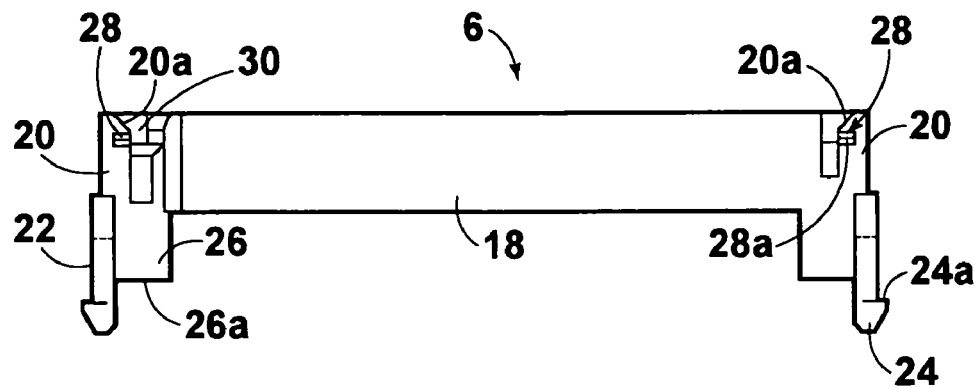
FIG. 4A is a right side view.
Figure 4B:
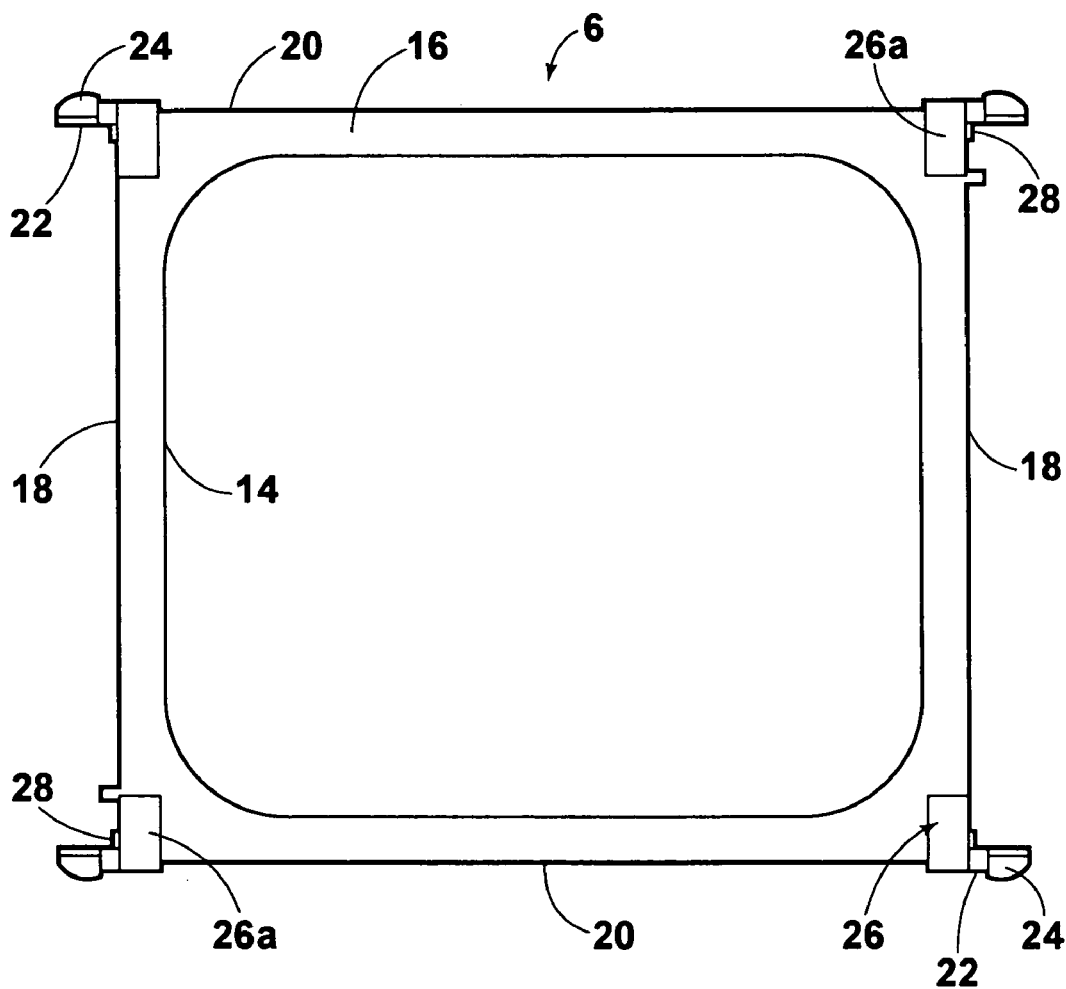
FIG. 4B is a bottom view of the frame of FIG. 3.

Embodiments of the IC socket assembly (hereinafter, simply referred to as "assembly") according to the present invention will now described in greater detail with reference to the attached drawings. Referring first to FIGS. 1 and 2, the assembly 1 includes a frame 6, which is placed on a first surface 2a of the circuit board 2 and a back plate 8, which is mounted under the frame 6 on a second surface 2b opposite the first surface 2a of the circuit board 2. A socket housing 4 (hereinafter, simply referred to as "housing") is provided within the frame 6 along with a heat sink 10 which is mounted atop the housing 4. Loading beam subassemblies (hereinafter, simply referred to as "subassemblies") 12 are provided atop the heat sink 10. Electrical contacts 3, are electrically connected to conductive pads (not shown) of the circuit board 2. It should be understood that a number of such electrical contacts 3 are arranged in a matrix on the circuit board mounting surface 4a of the housing 4.

The frame 6 will be described in further detail with reference to FIGS. 3A, 3B, 3C, 4A, and 4B. The frame 6 functions as a guide for the heat sink 10 during mounting thereof. The frame 6 comprises a bottom wall 16, which has a substantially rectangular opening 14, and side walls 18 and 20, which extend from the periphery of the bottom wall 16. Downwardly extending mounting legs 22 are provided at the four corners of the frame 6. The mounting legs 22 are positioned along the side walls 20 on the exteriors thereof, and have outwardly facing engaging protrusions 24 formed on the tips thereof. The engaging protrusions 24 have upwardly facing steps 24a. Downwardly extending standoffs 26 are provided on the bottom wall 16, adjacent to the mounting legs 22. The lower ends of the standoffs 26 include flat abutment surfaces 26a, for abutting the circuit board 2 when the frame 6 is mounted thereon.

Tapers 18a and 20a are formed at the interior sides of the upper edges of the side walls 18 and 20. The tapers 18a and 20a serve as guides during mounting of the heat sink. Latch protrusions 28 extend from the side walls 20 are near their ends. Each of the latch protrusions 28 comprises a downwardly facing taper 28a, an upwardly facing engagement surface 28b, and an intermediate surface 28c between the taper 28a and the engagement surface 28b (refer to FIG. 3B). Recesses 30 are formed in a single end of each of the side walls 18 so that they are positioned at opposing corners of the frame 6. Operating portions 80 of levers 72 (refer to FIG. 11), to be described later, are positioned in these recesses 30. The manner in which the operating portions 80 are positioned in the recesses 30 will be described later.

Figure 5:
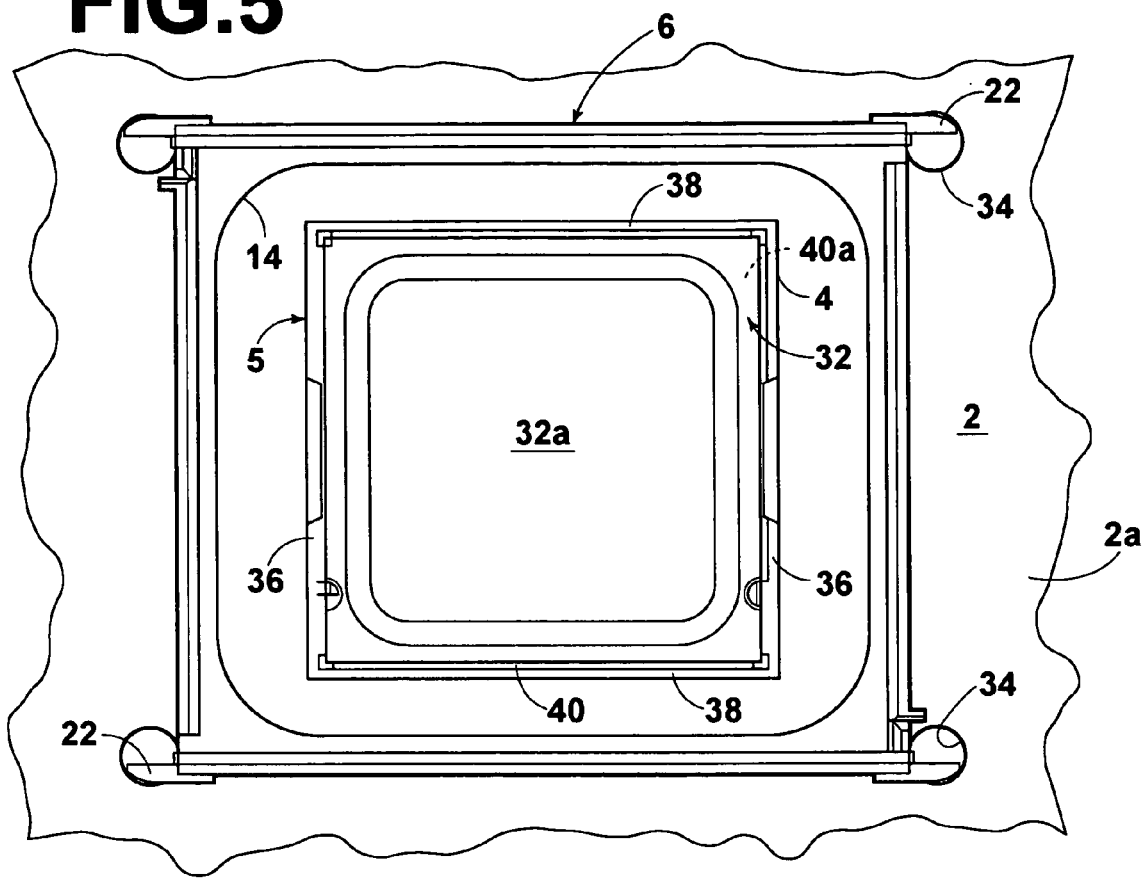
FIG. 5 is a plan view showing the frame and the IC socket of the IC socket assembly of FIG. 1 are mounted on the circuit board.
Figure 6:
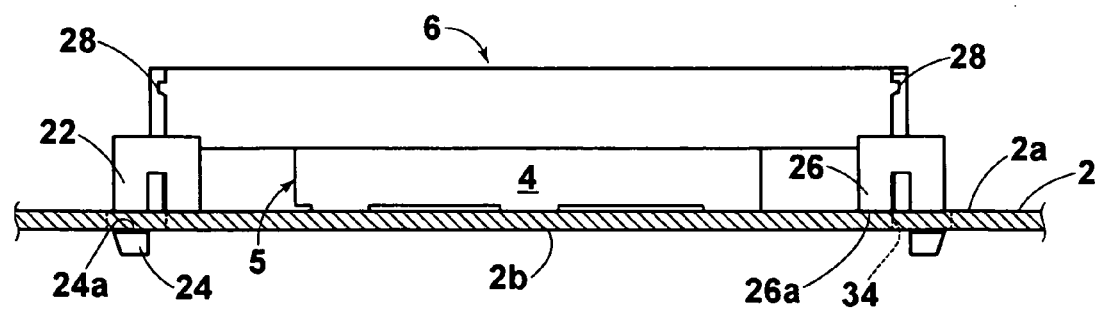
FIG. 6 is a front view showing the frame and the IC socket of the IC socket assembly of FIG. 1 mounted on the circuit board.

Next, the frame 6 mounted on the circuit board 2 along with the IC socket 5 will be described with reference to FIG. 5 and FIG. 6. The IC socket 5 is surface mounted on the circuit board 2. As can be seen in FIG. 5, the frame 6 and the IC socket 5 are separated, and are not in contact with each other. An IC package 32 is mounted within the IC socket 5 (refer to FIG. 5). The frame 6 is mounted so that the IC socket 5 is positioned at the center of the opening 14 thereof. The mounting legs 22 of the frame 6 are inserted through apertures 34 of the circuit board 2 from the first surface 2a to the second surface 2b thereof. The steps 24a of the engaging protrusions 24 engage with the second surface 2b, thereby preventing extraction of the mounting legs 22 (refer to FIG. 6). At this time, the abutment surfaces 26a of the standoffs 26 abut the first surface 2a of the circuit board 2, thereby preventing further movement toward the circuit board 2.

Note that the IC socket 5 and the IC package 32 are those such as disclosed in Japanese Patent Application No. 2002-317646. However, any known IC socket may be employed. Accordingly, here, detailed descriptions of the IC socket 5 and the IC package 32 will be omitted, and only the basic outlines thereof will be described. The basic structure of the IC socket is illustrated in FIG. 5. That is, the IC socket 5 comprises a rectangular housing 4 for housing the electrical contacts 3 (refer to FIG. 2), and walls 36 and 38, which are formed at the outer periphery of the housing 4. The IC package 32 is to be received on an IC package mounting surface 40 of a package receiving portion 40, which is defined by the walls 36 and 38. The upper surface 32a of the IC package 32 is flat. Therefore, a flat bottom surface 56a (refer to FIG. 10B) of the heat sink 10 is placed on the upper surface 32a, so that they establish surface contact with each other.

Next, the back plate 8, which is mounted on the second surface 2b of the circuit board 2, will be described with reference to FIGS. 7A, 7B, and 7C. The back plate 8 is formed by stamping and forming a single metal plate, and is of a rectangular shape. The back plate 8 comprises a flat rectangular main surface 42, and upwardly extending latch arms 44 and 46, which are perpendicular with respect to the main surface 42 and are provided at the four corners thereof. The latch arms 44 and 46 are disposed at opposing corners of the back plate 8.

The latch arms 44 are disposed at positions corresponding to those of the apertures 34 of the circuit board 2. The latch arms 46 are disposed at positions that correspond to those of the recesses 30 of the frame 6. Circular apertures 48 are provided at the tips of the latch arms 44. Upwardly facing inclined surfaces 50a and downwardly facing engagement surfaces 50b are formed on the interior surfaces of the tips of the latch arms 46. In addition, cutouts 52 that correspond to the latch protrusions 28 of the frame 6 are formed at the edges of each of the latch arms 44 and 46 that face each other (refer to FIG. 7B).

Figure 8:
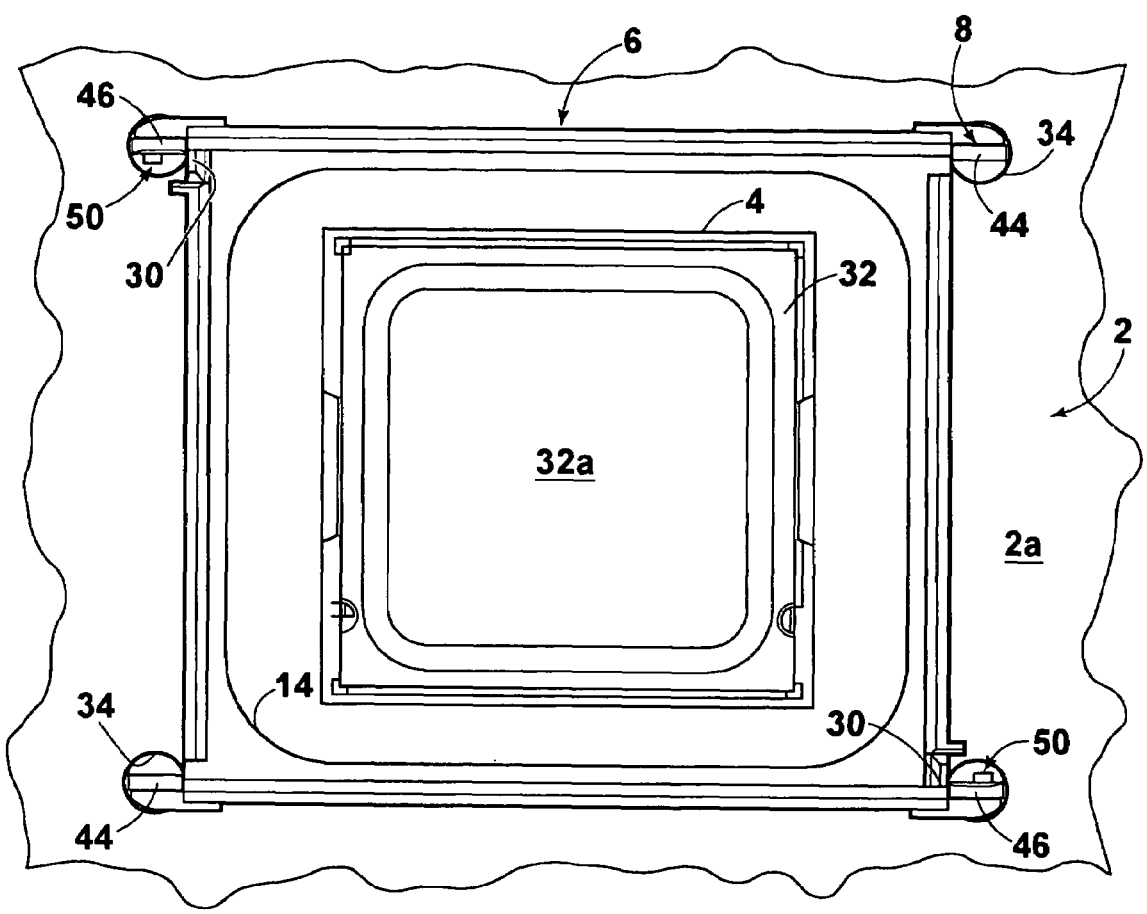
FIG. 8 is a plan view of the back plate mounted on the circuit board of FIG. 5, on which the frame and a housing are mounted as well.
Figure 9:
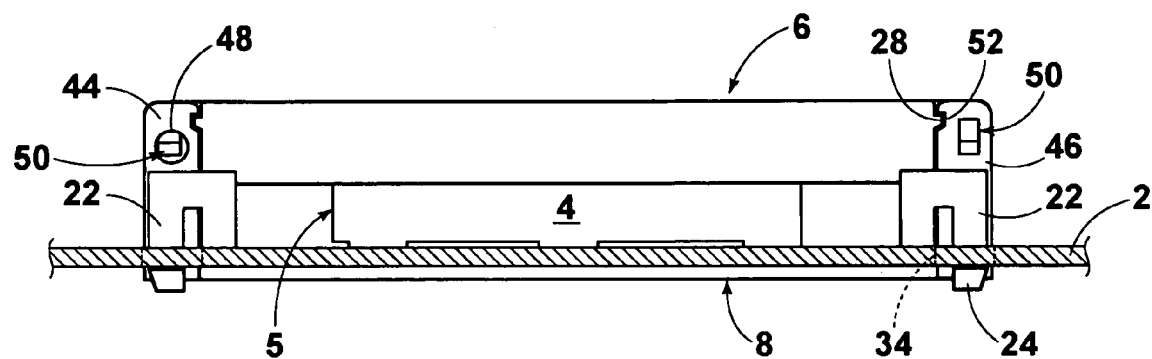
FIG. 9 is a front view of the back plate mounted on the circuit board of FIG. 5, on which the frame and the housing are mounted as well.

FIG. 8 and FIG. 9 illustrate the back plate 8, formed as described above, and assembled to the structure shown in FIG. 5. The latch arms 44 and 46 are inserted through the apertures 34 from the second surface 2b of the circuit board. The cutouts 52 engage the latch protrusions 28 of the frame 6, to engage the frame 6 (refer to FIG. 9). Thereby, the back plate 8 is prevented from dropping away from the circuit board 2. In this state, the back plate 8 is in close contact with the second surface 2b of the circuit board 2, so that the main surface 42 of the back plate 8 supports the circuit board 2, on which the IC socket 5 is provided. That is, the back plate 8 supports both the circuit board 2 and the housing 4 so that the coplanarity therebetween is achieved.

Figure 10A:
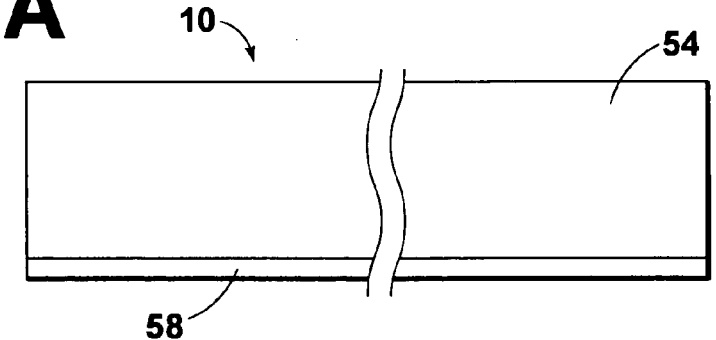
FIG. 10A is a front view and FIG. 10B is a side view of a heat sink.
Figure 10B:
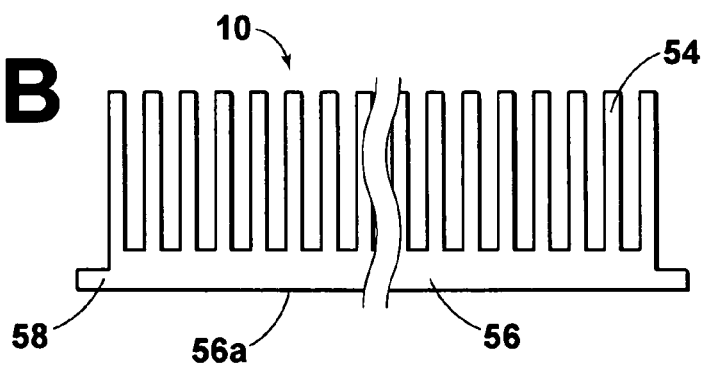

Next, the heat sink 10 to be mounted on the IC package 32 will be described with reference to FIGS. 10A and 10B. FIG. 1 will also be referred to in the description. The heat sink 10 is metallic and is of a rectangular shape. The heat sink 10 comprises a planar base 56, and a plurality of fins 54, which are integrally formed on the upper surface of the base 56 and are spaced at predetermined intervals. The fins 54 are separated from each other, and exhibit heat dissipating effects due to increased surface areas in contact with the air. Flanges 58 that extend in the longitudinal directions of the fins 54 are formed at two ends of the base 56. The bottom surfaces of the flanges 58 are coplanar with the bottom surface 56a of the base 56, and constitute portions thereof.

The shape of the heat sink 10 substantially complements that of the frame 6. The heat sink 10 is dimensioned to extend across the entire space within the frame 6. During mounting of the heat sink 10 within the frame 6, the heat sink 10 is positioned by the frame 6, as illustrated in FIG. 1. In addition, the tapers 18a and 20a guide in the placement of the heat sink 10. Thereby, the bottom surface 56a of the case 56, that is, the heat sink 10, contacts the upper surface 32a of the IC package 32.

Next, the subassemblies 12 will be described with reference to FIGS. 11A, 11B, and 11C. Note that FIG. 1 and FIG.

2 will also be referred to in the description of the subassembly 12. The state of the subassembly 12, as illustrated in FIG. 11, is the same as that shown in FIG. 1 and FIG. 2. That is, FIGS. 1, 2, and 11 show the subassembly 12 as not applying pressure on the heat sink 10. The subassembly 12 is of a two piece construction, comprising a generally linear loading beam 60, and a lever 72, which is pivotally mounted at the center of the loading beam 60 via a pin 74. The loading beam 60 is formed by stamping and forming a single metal plate, and extends substantially linearly. The loading beam 60 is of a length that enables it to extend from the latch arm 44 to the latch arm 46, which are provided along the longitudinal direction of the back plate 8. An L-shaped extension 66, which extends downward then slightly in the longitudinal direction of the loading beam 60, is formed on a first end thereof.

A protrusion 62, which is bent toward the exterior in a direction perpendicular to the surface of the loading beam 60, is formed at the tip of the extension 66. The protrusion 62 is for engaging the aperture 48 of the latch arm 44. A rectangular engagement piece 68, which is coplanar with the loading beam 60 and extends vertically, is formed at a second end of the loading beam 60. A actuating portion which is bent perpendicularly in the same direction as the protrusion 62, is formed at the upper edge of the engagement piece 68. A rectangular engagement aperture 64 is formed in the lower portion of the engagement piece 68. The engagement aperture 64 is for engaging the latch protrusion 50 of the latch arm 46. An opening 68a is provided between the engagement aperture 64 and the actuating portion. A shaft aperture (not shown) is provided at the center, in the longitudinal direction, of the loading beam 60. The lever 72 is rotatably linked to the loading beam 60 via the pin 74, which is inserted through the shaft aperture. An opening 76 is provided in the loading beam 60 at a position slightly toward the protrusion 62 from the shaft aperture. A protrusion 80b of the lever 72 engages with the opening 76, to maintain the lever 72 in its initial position.

The lever 72 comprises an axial support portion 78 at a first end, which is axially supported by the pin 74, and an operating portion 80 at a second end. The operating portion 80 and the axial support portion 78 are linked by a linear arm 82. An operating piece 86 is formed by bending a portion of the operating portion 80 in the same direction as the protrusion 62, so that the operating piece 86 is in a plane perpendicular to the rotating direction 84 of the lever 72. The operating piece 86 serves to apply force on the lever 72 to rotate it with a finger. A protrusion 80a, for engaging with the opening 68a when the lever 72 is rotated to its final position, is provided at the operating portion 80 by being punched out.

To mount the subassembly 12 to the back plate 8, first, the protrusion 62 is engaged with the aperture 48, as illustrated by the broken lines of FIG. 2. Then, the actuating portion is urged from above to engage the latch protrusion 50 with the engagement aperture 64. As can be seen in FIG. 1, a pair of identical subassemblies 12 are used, at opposite orientations. Therefore, the parts of the two subassemblies 12 are at opposing corners with respect to each other. Accordingly, when operating the pair of subassemblies 12, the directions in which they are operated are reversed.

The axial support portion 78 has an arcuate periphery. However, the position of the pin 74 is eccentric to the center of the axial support portion 78 thus defining a cam portion in the vincinty of the upper edge 78b. That is, the distance Da, from the lower edge 78a of the axial support portion 78 to the pin 74, and the distance Db, from the upper edge 78b of the axial support portion 78 to the pin 74, satisfy a relationship Db>Da. Accordingly, the lower edge 78a does not abut the flange 58 of the heat sink 10 when the lever 72 is in its initial position, as shown in FIG. 2. That is, when the lever 72 is in its initial position, no pressure is applied to the flange 58 of the heat sink 10 thereby. Note that the aforementioned frame 6, the back plate 8, and the subassemblies 12 are collectively referred to as a fixing member.

Figure 12C:
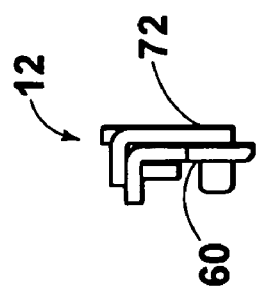
FIG. 12C is a side view of the loading beam subassembly in a closed position.
Figure 12A:
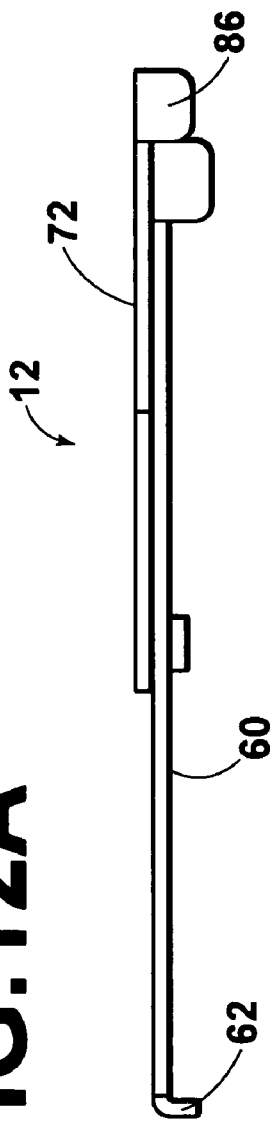
FIG. 12A is a plan view.
Figure 12B:
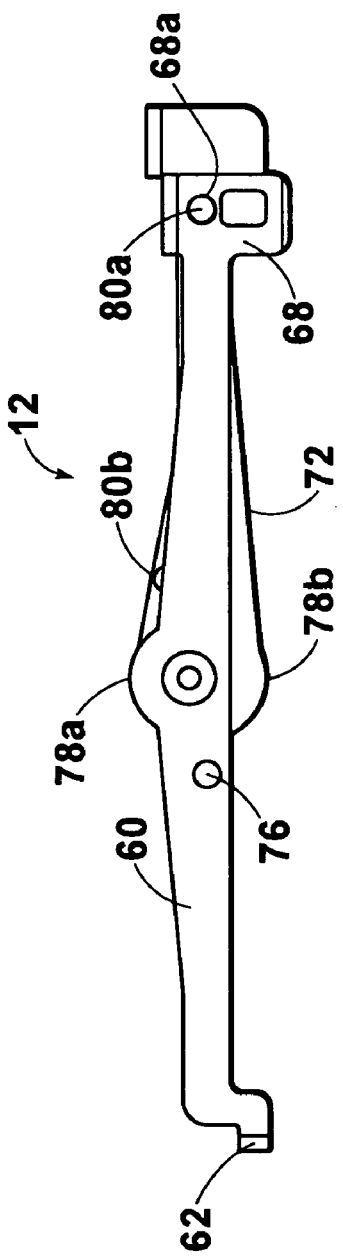
FIG. 12B is a front view.

Next, the lever 72 is rotated to its final position will be described with reference to FIGS. 12A, 12B, 12C, 13, and 14. FIG. 12A is a plan view, FIG. 12B is a front view, and FIG. 12C is a side view of the subassembly 12, in which the lever 72 is rotated to its final position. FIG. 13 is a front view of the assembly 1 mounted on the circuit board 2, in the lever 72 is rotated to its final position. FIG. 14 is a plan view of the assembly 1 and the circuit board 2 of FIG. 13.

When the lever 72 is rotated to its final position, the protrusion 80a engages with the opening 68a of the engagement piece 68, to lock the lever 72 in its final position, as shown in FIG. 12B. At this time, the upper edge 78b and the lower edge 78a of the lever 72 are vertically reversed, causing the upper edge 78b to protrude downwardly. This downward protrusion causes the lever 72 to press the flange 58 of the heat sink 10 downward, thereby fixing the heat sink 10 in a state of close contact with the IC package 32, as shown in FIG. 13. As described above, the axial support portion 78 is axially supported in an eccentric manner by the loading beam 60 so that the periphery of the axial support portion 78 presses the heat sink 10 accompanying rotation of the lever 72.

As clearly illustrated in FIG. 13, the circuit board 2, on which the housing 4 of the IC socket 5 is mounted, is supported to be flat by the back plate 8. The IC package 32, which is mounted on the upper portion of the housing 4, is pressed by the flat bottom surface 56a of the heat sink 10. Therefore, there is no cause for deformation or warping of the housing 4. Accordingly, the reliability of the electrical connections between the housing 4 and the circuit board 2 is maintained in an extremely favorable state.

Figure 15A:
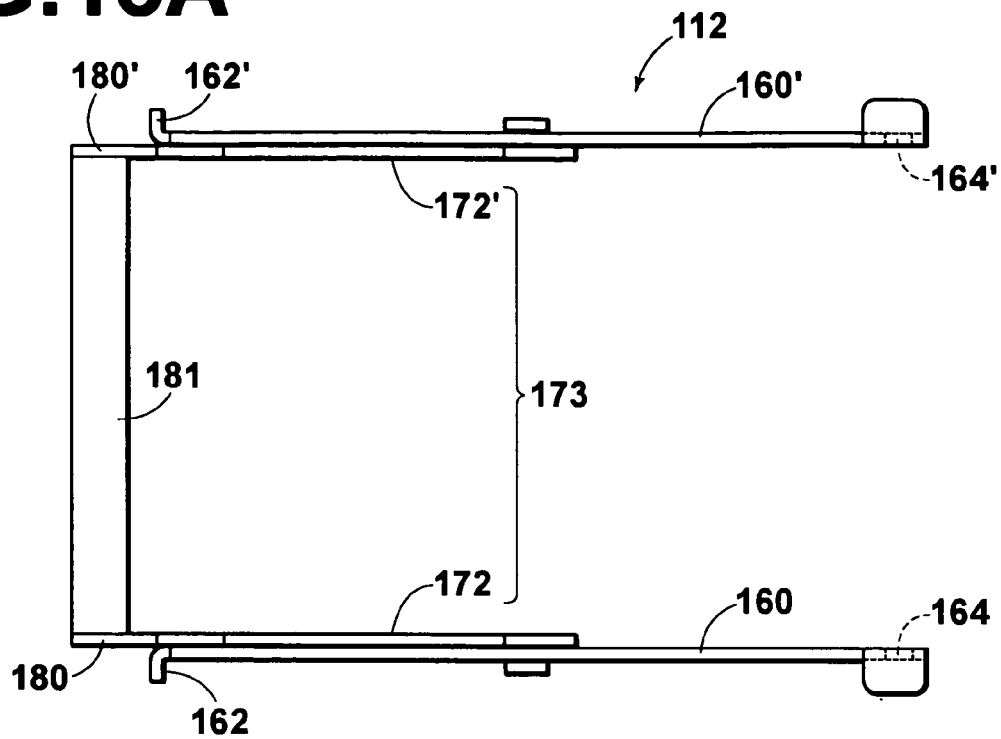
FIG. 15A is a plan view.
Figure 15B:
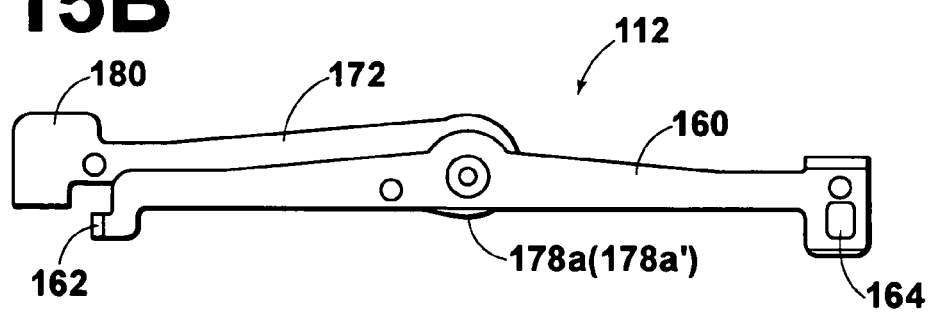
FIG. 15B is a front view.
Figure 15C:
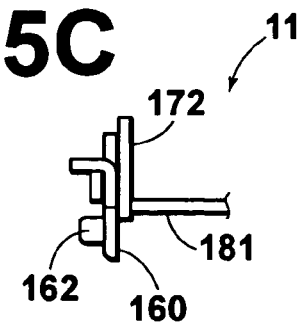
FIG. 15C is a partial side view of a loading beam subassembly, which is utilized in an IC socket assembly according to a second embodiment of the present invention.

Next, an assembly 100 (refer to FIG. 17) according to a second embodiment of the present invention will be described. The assembly 100 comprises a subassembly 112, which is a modified version of the subassembly 12, which was utilized in the first embodiment. The subassembly 112 according to this modification is of a one piece construction. Note that FIG. 15 corresponds to FIG. 11. First, the subassembly 112 will be described with reference to FIGS. 15A, 15B and 15C. In the first embodiment, two identical subassemblies 12 were employed in opposite orientations. However, the subassembly 112 comprises a loading beam 160, which is of the same shape as the loading beam 60, and a loading beam 160', which is symmetrical in shape to the loading beam 160. The subassembly 112 also comprises a lever 172 and a lever 172', which is symmetrical in shape to the lever 172. The operating portion 180 of the lever 172 and the operating portion 180' of the lever 172' extend toward each other, and are linked by a connecting bar 181, thereby forming a one piece lever 173. Engagement apertures 164 and 164' are provided in the loading beams 160 and 160', respectively, at positions corresponding to those of the engagement aperture 64 of the loading beam 60. Outwardly protruding protrusions 162 and 162' are formed at the ends of the loading beams 160 and 160', respectively. The subassembly 112 illustrated in FIG. 15 is in a state prior to pressing of the heat sink 10, in which lower edges 178a and 178a' of the levers 172 and 172' are positioned at the same height.

In this manner, because the shape of the one piece lever 173 differs from that of the lever 72, the shape of a frame 106, which is utilized in the assembly 100 also differs from that of the frame 6.

Figure 16A:
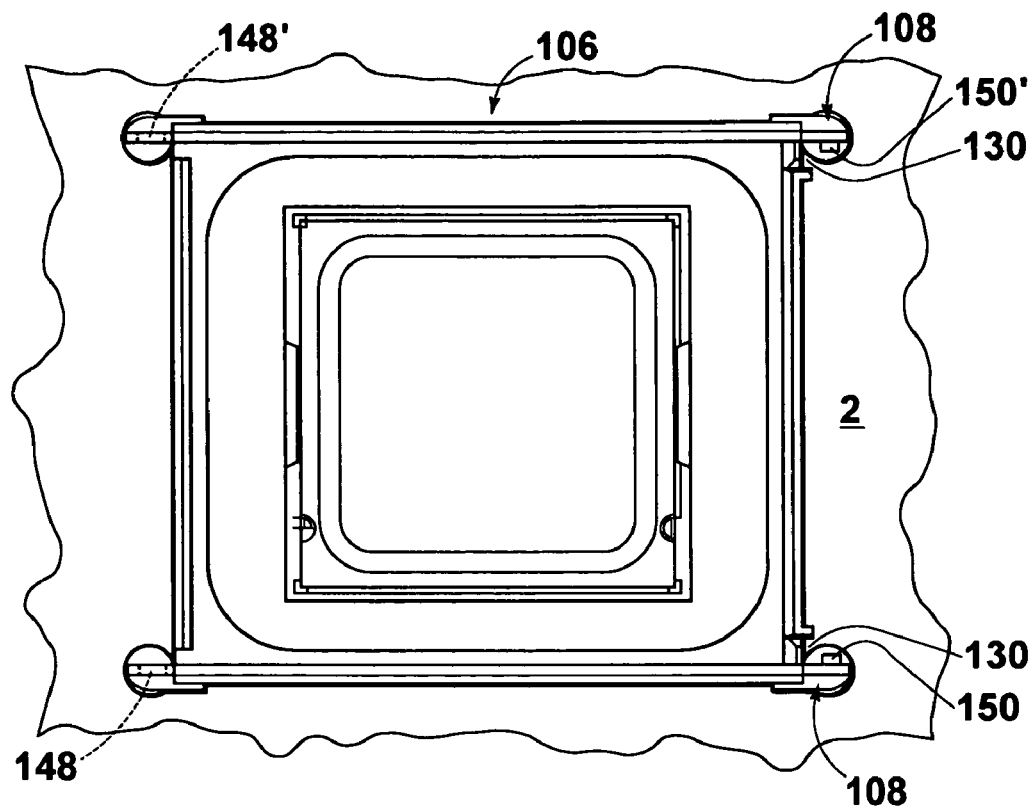
FIG. 16A is a plan view.
Figure 16B:
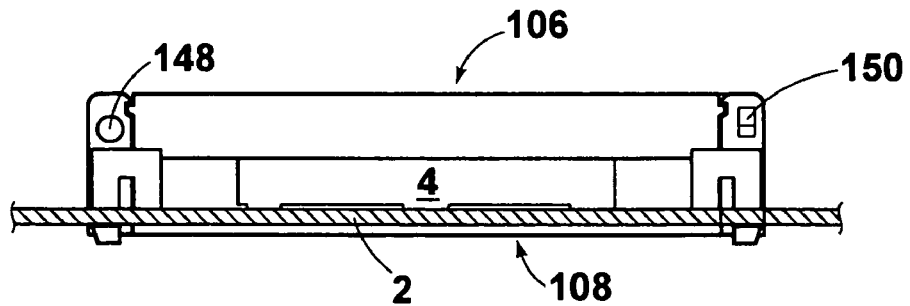
FIG. 16B is a front view of a frame, which is utilized in the IC socket assembly according to the second embodiment.

Next, the frame 106 will be described with reference to FIGS. 16A and 16B. FIG. 16A corresponds to FIG. 8, and FIG. 16B corresponds to FIG. 9. Both FIGS. 16A and 16B show the frame 106 and a back plate 108 are mounted on the circuit board 2. The frame 106 and the back plate 108 are basically similar in shape to the frame 6 and the back plate 8. Hereinafter, only the differences between the frames and the back plates of the first and second embodiments will be described, and descriptions regarding parts having the same structure will be omitted.

First, it should be noted that recesses 130 are formed on the same side of the frame 106, as illustrated in FIG. 16A. The recesses 130 correspond to the operating portions 180 and 180' of the one piece lever 173. In addition, latch protrusions 150, corresponding to the engagement apertures 164 and 164' of the loading beams 160 and 160', are formed on the same side of the back plate 108. Further, apertures 148, corresponding to the protrusions 162 and 162', are formed on the same side of the back plate 108.

Figure 17A:
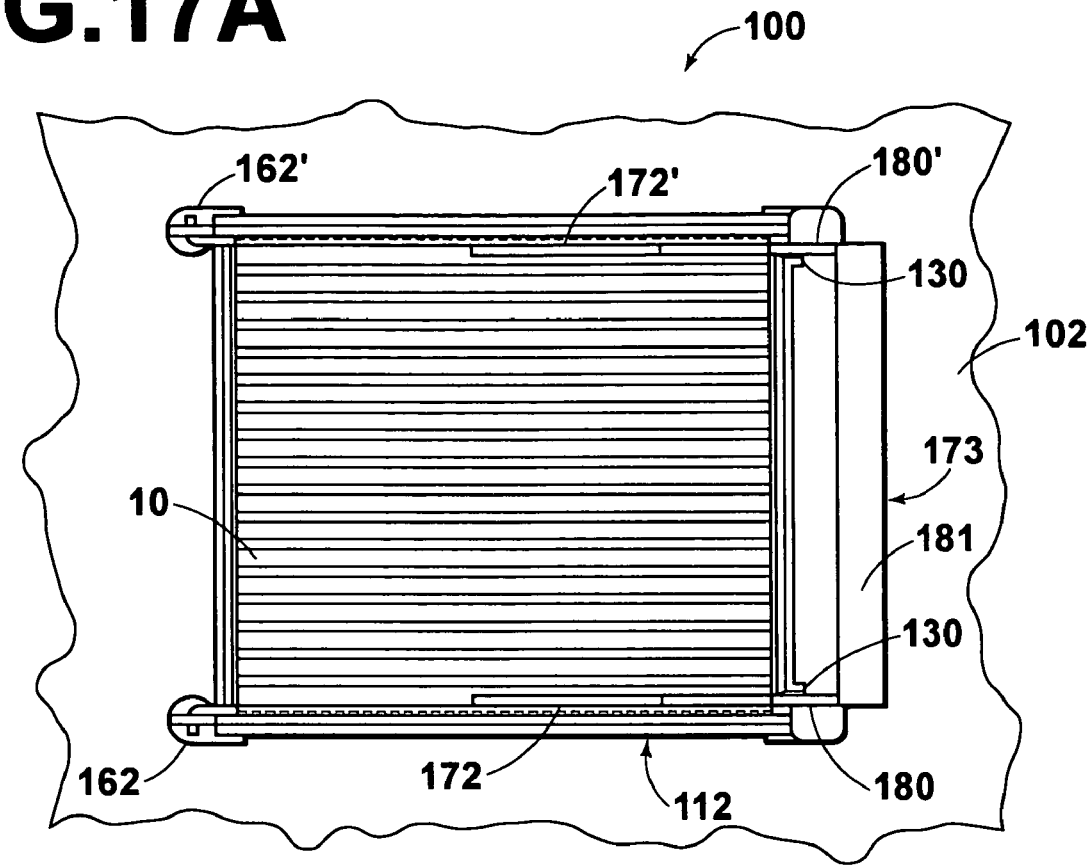
FIG. 17A is a plan view.
Figure 17B:
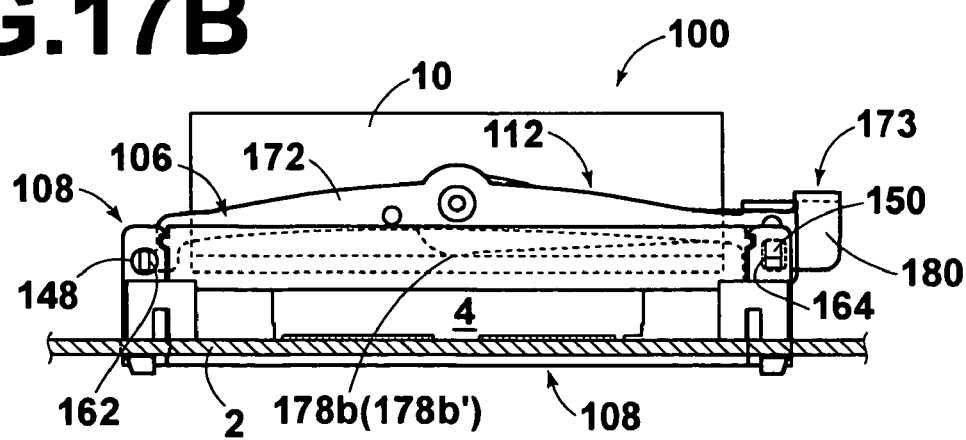
FIG. 17B is a front view illustrating the IC socket assembly according to the second embodiment, along with the housing and the heat sink.

Next, the assembly 100 according to the second embodiment, in which the frame 106, the back plate 108, and the subassembly 112 is assembled, will be described with reference to FIGS. 17A and 17B. FIGS. 17A and 17B illustrate the one piece lever 173 rotated to its final position, and pressing against the heat sink 10. As clearly shown in FIGS. 17A and 17B, the protrusions 162 are engaged with the apertures 148, and the latch protrusions are engaged with the engagement apertures 164. It can also be seen from FIG. 17A that the operating portions 180 and 180' are positioned in the recesses 130. At this time, the upper edges 178b and 178b' of the levers 172 and 172' press the flange 58 of the heat sink 10, in the same manner as in the first embodiment (refer to FIG. 17B).

Coplanarity between a circuit board mounting surface of a housing of an IC socket assembly and a circuit board is secured, by preventing warp and deformation of the housing, even if a heat sink is mounted thereon.

The flatness of the circuit board, on which the housing is mounted, is maintained even if pressure exerted during mounting of the heat sink is applied to the housing, by the back plate. Specifically, the housing of the assembly is sandwiched and held between the heat sink and the back plate (via the circuit board) in a pressurized state. Force is not applied to the housing in a bending direction, therefore the coplanarity between the housing and the printed circuit board is secured. Accordingly, warping and deformation of the hosing is effectively reduced, thereby securing the reliability of electrical connections between the socket assembly and the circuit board. In addition, a pair of loading beams and levers, that is, a pair of identical subassemblies, is utilized. Therefore, common parts may be employed, thereby reducing the number of part types.

In the case that the pair of levers are joined via a link portion, the necessity to operate the levers individually is obviated, thereby facilitating lever operation. Further, the number of parts is reduced, because a single type of lever is used in common.

Preferred embodiments of the present invention have been described in detail above. However, the invention is not limited to the above embodiments. It goes without saying that various modifications and changes are possible by one skilled in the art.

For example, the back plates 8 and 108 may be provided with an opening or a recess formed by drawing, to enable mounting of an electronic component on the second surface 2b of the circuit board 2. The electronic component may be mounted within the opening or the recess.

What is claimed is:

1. An IC socket assembly having a plurality of electrical contacts, an insulative socket housing for housing the plurality of electrical contacts, a heat sink for dissipating heat generated by an IC package, which is mounted on an IC package mounting surface of the socket housing and a fixing member for fixing the heat sink to the socket housing, the fixing member comprising:
   a frame having mounting legs extending downward through apertures of a circuit board, the frame being mounted on a first surface of the circuit board, on which the socket housing is mounted;
   a back plate, which is mounted on a second surface of the circuit board opposite the first surface, having engaging arms, which are inserted through the apertures of the circuit board and engage the frame;
   a pair of loading beams, which are fixed to the engaging arms;
   a pair of levers, each lever being axially supported by a loading beam; and
   a cam portion having a rotatable eccentric portion for varyingly pressing against a flange portion of the heat sink upon rotation of the eccentric portion and being located on at least one of the levers such that movement of the lever relative to the loading beam causes the cam portion to press against a flange portion of the heat sink, thereby urging the heat sink toward the socket housing.

2. An IC socket assembly as defined in claim 1, wherein the pair of levers are joined via a link portion.

3. An IC socket assembly as defined in claim 2, wherein the link portion is provided to link the free ends of each of the pair of levers.

4. The IC socket assembly of claim 1 wherein the mounting legs have engaging protrusions which engage the second surface of the circuit board.

5. A heat sink fixing member of an IC socket assembly comprising:
   a frame having mounting legs extending downward through apertures of a circuit board, the frame being mountable on a first surface of the circuit board, on which a socket housing is mounted;
   a back plate, being mountable on a second surface of the circuit board opposite the first surface, having engaging arms, which are inserted through the apertures of the circuit board to engage the frame;
   a pair of loading beams, which are fixed to the engaging arms;
   a pair of levers, each lever being axially supported by a loading beam; and
   a cam portion having a rotatable eccentric portion for varyingly pressing against a flange portion of the heat sink upon rotation of the eccentric portion and being located on at least one of the levers such that movement of the lever relative to the loading beam causes the cam portion to press against a flange portion of the heat sink, thereby urging the heat sink toward the socket housing.

6. The heat sink fixing member of claim 5 wherein the pair of levers are joined by a link portion.

7. The heat sink fixing member of claim 6 wherein the link portion is provided to link the free ends of each of the pair of levers.

8. The heat sink fixing member of claim 5 wherein the mounting legs have engaging protrusions which engage the second surface of the circuit board.

9. An IC socket assembly having a plurality of electrical contacts, an insulative socket housing for housing the plurality of electrical contacts, a heat sink for dissipating heat generated by an IC package, which is mounted on an IC package mounting surface of the socket housing and a fixing member for fixing the heat sink to the socket housing, the fixing member comprising:
- a frame having mounting legs extending downward through apertures of a circuit board, the frame being mounted on a first surface of the circuit board, on which the socket housing is mounted;
- a back plate, which is mounted on a second surface of the circuit board opposite the first surface, having engaging arms, which are inserted through the apertures of the circuit board and engage the frame;
- a pair of loading beams, which are fixed to the engaging arms;
- a pair of levers, each lever being pivotally connected to a loading beam; and
- a cam portion having a rotatable eccentric portion for varyingly pressing against a flange portion of the heat sink upon rotation of the eccentric portion and being located on at least one of the levers such that movement the lever relative to the loading beam causes the cam portion to press against a flange portion of the heat sink, thereby urging the heat sink toward the socket housing.

10. An IC socket assembly as defined in claim 9, wherein the pair of levers are joined via a link portion.

11. An IC socket assembly as defined in claim 10, wherein the link portion is provided to link the free ends of each of the pair of levers.

12. The IC socket assembly of claim 9 wherein the mounting legs have engaging protrusions which engage the second surface of the circuit board.

13. A heat sink fixing member of an IC socket assembly comprising:
- a frame having mounting legs extending downward through apertures of a circuit board, the frame being mountable on a first surface of the circuit board, on which a socket housing is mounted;
- a back plate, being mountable on a second surface of the circuit board opposite the first surface, having engaging arms, which are inserted through the apertures of the circuit board to engage the frame;
- a pair of loading beams, which are fixed to the engaging arms;
- a pair of levers, each lever being pivotally connected to a loading beam; and
- a cam portion having a rotatable eccentric portion for varyingly pressing against a flange portion of the heat sink upon rotation of the eccentric portion and being located on at least one of the levers such that movement of the lever relative to the loading beam causes the cam portion to press against a flange portion of the heat sink, thereby urging the heat sink toward the socket housing.

14. The heat sink fixing member of claim 13 wherein the pair of levers are joined by a link portion.

15. The heat sink fixing member of claim 14 wherein the link portion is provided to link the free ends of each of the pair of levers.

16. The heat sink fixing member of claim 13 wherein the mounting legs have engaging protrusions which engage the second surface of the circuit board.

* * * * *